(12) United States Patent
Le Rhun et al.

(10) Patent No.: US 11,417,723 B2
(45) Date of Patent: Aug. 16, 2022

(54) METAL-INSULATOR METAL STRUCTURE AND METHOD OF FORMING THE SAME

(71) Applicant: Commissariat A L'Energie Atomique et aux Energies Alternatives, Paris (FR)

(72) Inventors: Gwenael Le Rhun, Grenoble (FR); Christel Dieppedale, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 672 days.

(21) Appl. No.: 16/445,290

(22) Filed: Jun. 19, 2019

(65) Prior Publication Data

US 2020/0013852 A1    Jan. 9, 2020

(30) Foreign Application Priority Data

Jun. 22, 2018    (FR) ...................................... 18 55595

(51) Int. Cl.
*H01L 49/02* (2006.01)
*H01L 41/312* (2013.01)
*H01L 41/187* (2006.01)

(52) U.S. Cl.
CPC .............. *H01L 28/55* (2013.01); *H01L 28/65* (2013.01); *H01L 41/312* (2013.01); *H01L 41/1876* (2013.01)

(58) Field of Classification Search
CPC ....... H01L 28/55; H01L 28/65; H01L 41/312; H01L 41/1876; H01L 2221/6835; H01L 2221/68363; H01L 21/6835
See application file for complete search history.

(56) References Cited

U.S. PATENT DOCUMENTS 6,333,202 B1    12/2001    Adkisson et al.
6,607,969 B1    8/2003    Kub et al.
(Continued)

FOREIGN PATENT DOCUMENTS

CN    108173525    6/2018
EP    3 125 293 A2    2/2017

OTHER PUBLICATIONS

French Search Report dated Mar. 1, 2019 in French Application 18 55595, filed on Jun. 22, 2018 (with English Translation of Categories of Cited Documents).

(Continued)

*Primary Examiner* — David Vu
(74) *Attorney, Agent, or Firm* — Oblon, McClelland, Maier & Neustadt, L.L.P.

(57) ABSTRACT

A method for producing a metal-insulator-metal (MIM) type structure is provided, including producing, on a first substrate, first and second separation layers arranged one against the other; producing, on the second separation layer, an insulator layer including a perovskite structure material; producing a first gold and/or copper layer on the insulator layer, forming at least one part of a first electrode; making the first gold and/or copper layer integral with a second substrate; and forming a mechanical separation at an interface between the first and the second separation layers, the first separation layer remaining integral with the first substrate and the second separation layer remaining integral with the insulator layer, the insulator layer being arranged between the first electrode and a second electrode including at least one metal layer.

10 Claims, 2 Drawing Sheets

(56) References Cited

U.S. PATENT DOCUMENTS

2003/0186521 A1* 10/2003 Kub .................. H01L 21/76254
 438/558
2017/0033174 A1  2/2017 Rodriguez et al.
2018/0278236 A1  9/2018 Hurwitz

OTHER PUBLICATIONS

Maszara, W. P., et al., "Bonding of silicon wafers for silicon-on-insulator", Journal of Applied Physics 64, 1988. pp. 4943-4950.

* cited by examiner

METAL-INSULATOR METAL STRUCTURE AND METHOD OF FORMING THE SAME

TECHNICAL FIELD AND PRIOR ART

The invention pertains to a Metal-Insulator-Metal, or MIM, type structure and a method for producing such a structure. The invention notably applies to the field of the production of MEMS (micro electro mechanical system) and/or NEMS (nano electro mechanical system) components and/or microelectronic components produced from such MIM structures. The invention advantageously applies to the production of piezoelectric and/or pyroelectric and/or ferroelectric transducers, and/or components including MIM capacitors and capacitances, and/or ferroelectric memory components, from such MIM structures.

Generally speaking, components including an MIM structure are produced such that the resistivity of the electrodes of this structure is the lowest possible in order to minimise the line resistances or series resistances, and thereby increase the quality factor of these components. To do so, the electrodes of the MIM structure are ideally formed by gold or copper layers.

The insulator material used in these structures is generally a perovskite structure material, such as for example BST ($Ba_{1-X}Sr_XTiO_3$), BCTZ ($Ba_XCa_{1-X}T_YZr_{1-Y}O_3$) or PZT (Pb($Zr_X,Ti_{1-X}$)$O_3$), which requires, for its crystallisation, reaching temperatures comprised between around 400° C. and 900° C. Yet, such temperatures significantly degrade gold or copper.

Thus, on account of the temperatures reached for the production of the insulator material, the lower electrode on which the insulator material is crystallised is generally formed of a single platinum layer which can withstand such temperatures, and only the upper electrode, produced on the insulator layer after its crystallisation, is formed of a gold or copper layer. However, an electrode including platinum and not gold or copper has a high resistivity, and thus a higher series resistance, which reduces the performances of the MIM structure including the quality coefficient. It is thus sought to reduce as much as possible the series resistance (or line resistance) of MIM structures, notably when these structures form capacitances used for RF applications.

The document EP 3 125 293 A2 describes an electrode of MIM structure on which the insulator layer is crystallised and which has a resistivity lower than that of a platinum electrode. This particular electrode is formed of a gold layer on which is formed a $RuO_2$ layer forming a diffusion barrier then a platinum layer serving for the crystallisation of the material of the insulator layer. In this electrode, the diffusion barrier layer makes it possible to avoid the diffusion of gold into the platinum layer during the crystallisation of the insulator material on this electrode.

Although such an electrode has a lower resistivity than a platinum layer, this type of lower electrode does not make it possible to avoid diffusion from the insulator material into the lower layers, notably the diffusion of lead when the insulator material comprises lead (as is the case for example for PZT). In addition, the presence of $RuO_2$ and platinum layers makes the structure of this electrode more complex and limits the minimum resistivity value which can be reached.

DESCRIPTION OF THE INVENTION

There thus exists a need to propose an MIM type structure and a method for producing such a structure not having the drawbacks of the prior art, that is to say of which the production does not impose the presence of $RuO_2$ and platinum layers to form the lower electrode and of which the resistivity of the lower electrode is less than that of MIM structures of the prior art.

To do so, a method for producing an MIM type structure is proposed, including at least:
  producing, on a face of a first substrate, first and second separation layers arranged one against the other and such that the first separation layer is arranged between the first substrate and the second separation layer;
  producing, on the second separation layer, at least one insulator layer including at least one perovskite structure material;
  producing at least one first gold and/or copper layer on the insulator layer and intended to form at least one part of a first electrode of the MIM type structure;
  making the first gold and/or copper layer integral with a second substrate such that the first gold and/or copper layer is arranged between the insulator layer and the second substrate;
  mechanical separation at an interface between the first and second separation layers, such that the first separation layer remains integral with the first substrate and that the second separation layer remains integral with the insulator layer;
  and in which the insulator layer is arranged between the first electrode and a second electrode comprising at least one metal layer.

A structure of Metal-Insulator-Metal, MIM, type is also proposed, including at least:
  a first electrode comprising at least a first and a second gold and/or copper layer made integral one against the other;
  a second electrode comprising at least one metal layer;
  an insulator layer including at least one perovskite structure material and arranged between the first and second electrodes.

Such an MIM structure comprises a first electrode formed of two gold and/or copper layers made integral one against the other. Thus, this MIM structure may be produced while forming on a temporary substrate a part of this MIM structure notably including the insulator layer and one of the two gold and/or copper layers, then by transferring this part of the MIM structure onto a definitive substrate on which is found the other of the two gold and/or copper layers and by making the two gold and/or copper layers integral with each other.

In a more general manner, the production method proposes producing the first gold and/or copper layer, which forms at least one part of a first electrode of the MIM structure, on the insulator layer itself arranged on a temporary substrate, then transferring this assembly onto a definitive substrate, corresponding to the second substrate, with this first gold and/or copper layer arranged between the insulator layer and the second substrate. Due to the fact that the first gold and/or copper layer is produced after the insulator layer, the temperatures reached during the production of the insulator layer do not degrade the first gold and/or copper layer.

Moreover, the MIM structure and the method proposed here do not impose that one of the two electrodes of the MIM structure comprises a platinum layer and/or a $RuO_2$ layer.

Such an MIM structure is compatible with the fact that each electrode comprises gold and/or copper, and thus that the electrodes each have a low resistivity.

In the method proposed above, the second electrode may be formed by the second separation layer and optionally at least one gold and/or copper layer produced on this second separation layer, or instead be formed by a different layer, advantageously including gold and/or copper and produced on the insulator layer after having removed the second separation layer.

The stack of materials of this MIM structure is moreover easier to produce in the absence of platinum layer and/or $RuO_2$ layer in the first electrode.

In addition, this method is advantageous when the perovskite structure material of the insulator layer comprises lead, such as for example when this material corresponds to PZT or a material of the same family as PZT, because it makes it possible in this case to be free of the constraints linked to the integration of this material comprising lead, such that the thermal budget necessary for its deposition (which is not compatible with a substrate including CMOS components, or a glass substrate) and the diffusion of the lead into the other materials present, due to the fact that this material is not formed on the definitive substrate on which the MIM structure rests at the end of the method.

In addition, at the end of the mechanical separation at the interface between the first and second separation layers, the first substrate is not destroyed and may be reused to carry out a new transfer of layer(s) from the first substrate onto another second substrate.

Throughout the document, the term "on" is used without distinction of the orientation in space of the element to which this term relates. For example, in the characteristic "on one face of the first substrate", this face of the first substrate is not necessarily oriented upwards but may correspond to a face oriented along any direction. Moreover, the arrangement of a first element on a second element should be understood as being able to correspond to the arrangement of the first element directly against the second element, without any intermediate element between the first and second elements, or instead being able to correspond to the arrangement of the first element on the second element with one or more intermediate elements arranged between the first and second elements.

Each first and second gold and/or copper layers may correspond to a single layer of gold or copper, or instead correspond to a stack of several gold and/or copper layers.

The MIM structure may be arranged on a substrate. When this MIM structure is used for the production of RF (radiofrequency) components, this substrate may correspond to a HR, or High Resistivity, silicon substrate, that is to say of which the resistivity is greater than around 0.5 kΩ·cm, or even above 1 kΩ·cm, in order to limit the losses in these components.

The metal layer of the second electrode may comprise platinum.

The first and second layers of the first electrode may comprise gold or copper and may be thermocompressed one against the other.

The perovskite structure material may have a chemical composition of $ABO_3$ type, with A and B corresponding to two chemical elements different from each other.

The second electrode may further comprise a third gold and/or copper layer such that the metal layer of the second electrode is arranged between the third layer of the second electrode and the insulator layer. This third gold and/or copper layer makes it possible to lower the resistivity of the second electrode, notably when the material of the metal layer of the second electrode has a high resistivity, such as for example platinum.

A device is also described including at least one piezoelectric and/or pyroelectric and/or ferroelectric transducer, and/or an MIM type capacitor, and/or a ferroelectric memory, including at least one part of such an MIM type structure.

The method may further comprise, before the making integral step, a step of producing at least one second gold and/or copper layer on the second substrate, and in which the making integral step comprises making the first and second gold and/or copper layers integral one against the other, the first electrode of the MIM type structure being formed of the first and second gold and/or copper layers.

The first and second layers forming the first electrode may comprise gold or copper, and the making integral step may comprise the implementation of a thermocompression of the first and second layers one against the other. In this case, it is possible to have one or more other layers of materials present between the first gold and/or copper layer and the insulator layer, and/or between the second gold and/or copper layer and the second substrate. The thermocompression may be implemented at a temperature less than or equal to around 400° C., or even less than around 150° C.

In an alternative, the making integral step may be implemented:
through at least one adhesive layer produced on the first gold and/or copper layer, and/or on the second substrate, or
by direct bonding between a first bonding layer produced on the first gold and/or copper layer, and a second bonding layer produced on the second substrate.

The second separation layer may correspond to the metal layer of the second electrode. Thus, this second separation layer may be conserved after the mechanical separation step, to serve as electrode layer for the components produced next from layers transferred onto the second substrate. In an alternative, it is possible to remove the second separation layer to deposit next the desired metal(s) to form the second electrode, or instead to deposit one or more additional metal layers on the second separation layer.

The method may further comprise, after the mechanical separation step, a step of producing a third gold and/or copper layer on the second separation layer. This third gold and/or copper layer makes it possible to reduce the resistivity of the second electrode, notably when the metal layer of the second electrode corresponds to the second separation layer which comprises platinum.

The second separation layer may be configured to form a crystallisation layer of the perovskite structure material, and the production of the insulator layer may comprise a crystallisation of the perovskite structure material on the second separation layer.

The making integral step may form a stack of different materials chosen such that the interface between the first and second separation layers corresponds to that, among all the interfaces of the stack, having the lowest adherence force, and:
one of the first and second separation layers may comprise at least $SiO_2$ and/or silicon nitride (such as SiN and/or $Si_3N_4$) and the other first and second separation layers may comprise at least one noble metal, and/or
the method may comprise, between the step of producing the first and second separation layers and the making integral step, the implementation of at least one step reducing an initial adherence force of the interface between the first and second separation layers.

In this method, the interface at which the mechanical separation is carried out may be defined beforehand by a judicious choice of the materials of the first and second separation layers bringing about naturally a low adherence force at this interface. By using on one side a noble metal and on the other $SiO_2$ and/or silicon nitride to form the first and second separation layers, a low adherence force is obtained at the interface of these two separation layers, without having to implement a specific step. Thus, after having made the two substrates integral with each other, the mechanical separation carried out at the interface between the first and second separation layers does not degrade the other layers because it is the interface between the first and second separation layers which has the lowest adherence force among all the interfaces of the stack obtained by making the first and second substrates integral with each other.

The use of a noble metal to form the first and second separation layers has the advantage of avoiding an oxidation of this separation layer in contact with the other separation layer which comprises $SiO_2$ and/or silicon nitride, notably the crystallisation of the material of the insulator layer.

In an alternative or as a complement to the production of the first and second separation layers from a noble metal and $SiO_2$ and/or silicon nitride, the adherence force at the interface between the first and second separation layers may be reduced by implementing a specific step, such as for example the formation of cavities at this interface.

The expression "all the interfaces of the stack" designates all the interfaces formed between two successive layers (arranged one directly against the other) of the stack.

The separation layer comprising $SiO_2$ and/or silicon nitride may correspond to a $SiO_2$ or silicon nitride layer, or to a stack of $SiO_2$ and silicon nitride.

The noble metal corresponds to one or more of the following materials: platinum (Pt), gold (Au), silver (Ag), rhodium (Rh), osmium (Os), palladium (Pd), ruthenium (Ru), iridium (Ir).

When the noble metal is intended to be exposed to high thermal budgets, for example up to a temperature equal to around 850° C., this noble metal advantageously comprises platinum and/or palladium. When the noble metal is intended to be exposed to lower temperatures, such as for example temperatures less than or equal to around 400° C., other noble metals (Au, Ag, Rh, Os, Ru, Ir) may be used to form this noble metal layer.

The adherence force of the interface between the first and second separation layers may be less than or equal to around 1.5 $J/m^2$, or preferably less than or equal to around 1 $J/m^2$. As an example, the adherence force between the first and second separation layers with one including $SiO_2$ and the other platinum is equal to around 1 $J/m^2$.

The adherence force between two layers of materials may be measured by the so-called blade insertion method described for example in the document W. P. Mazsara et al., "Bonding of silicon wafers for silicon-on-insulator", Journal of Applied Physics 64, p. 4943, 1988).

After the separation at the interface between the first and second separation layers, the free surface of the separation layer which comprises the noble metal has a very low roughness. It is thus not necessary to implement a polishing after having implemented the mechanical separation step. Advantageously, the noble metal may comprise platinum.

The first substrate may comprise semiconductor, for example silicon.

The second substrate may comprise semiconductor, for example silicon, or glass, or sapphire.

The method may be such that:
the perovskite structure material comprises lead;
said one of the first and second separation layers comprises $SiO_2$;
said at least one step reducing the initial adherence force of the interface between the first and second separation layers comprises the implementation of at least one thermal treatment forming, at the interface between the first and second separation layers, an alloy of lead and $SiO_2$ in liquid phase, then a cooling forming cavities at the interface between the first and second separation layers.

Such cavities contribute, alone or as a complement to the materials chosen to form the first and second separation layers, to obtaining the low adherence force at the interface between the first and second separation layers.

The method may further comprise:
between the production of the insulator layer and the production of the first gold and/or copper layer, the production of a first tie layer and/or a first diffusion barrier layer on the insulator layer, the first gold and/or copper layer being produced next on the first tie layer and/or on the first diffusion barrier layer, and/or
before the production of the second gold and/or copper layer, the production of a second tie layer and/or a second diffusion barrier layer on the second substrate, the second gold and/or copper layer being produced next on the second tie layer and/or on the second diffusion barrier layer.

BRIEF DESCRIPTION OF THE DRAWINGS

The present invention will be better understood on reading the description of exemplary embodiments given for only illustrative purposes and in no way limiting while referring to the appended drawings in which.

Identical, similar or equivalent parts of the different figures described hereafter bear the same numerical references so as to make it easier to go from one figure to the next.

The different parts shown in the figures are not necessarily shown according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Figure 1:
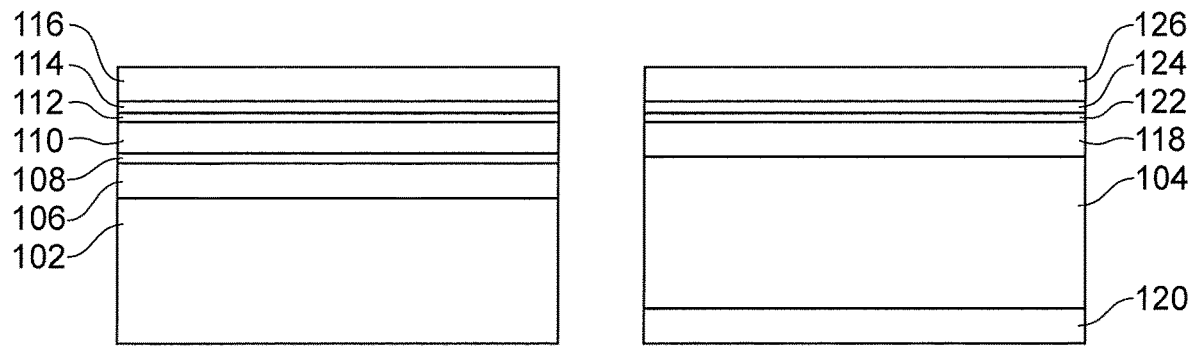
FIGS. 1 to 3 show the steps of a method for producing an MIM type structure, according to a particular embodiment.
Figure 2:
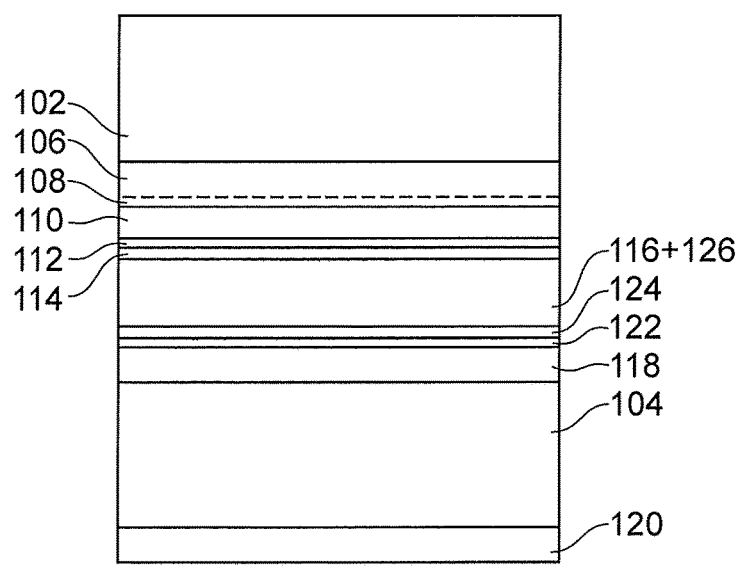
Figure 3:
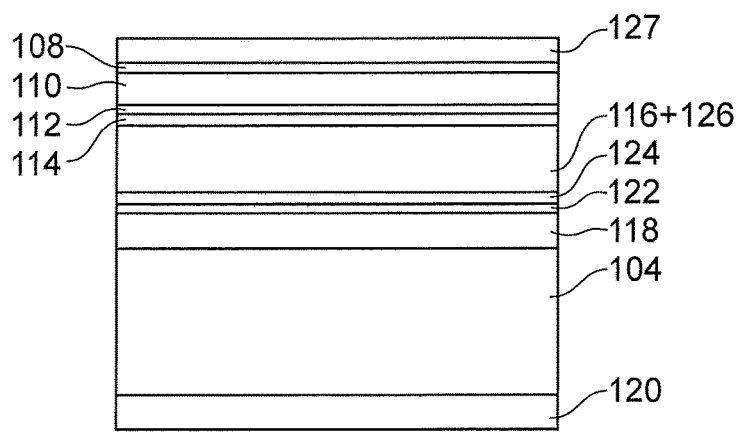

Reference is made to FIGS. 1 to 3 which show the steps of a method of producing an MIM structure 100 according to a particular embodiment.

As shown in FIG. 1, a first part of the MIM structure 100 is prepared on a first substrate 102, also called donor substrate. The layers or elements produced on the first substrate 102 will be thereafter transferred onto a second substrate 104, also called receiver substrate.

The first substrate 102 here corresponds to a semiconductor substrate including for example silicon, and of which the thickness is for example comprised between around 100 μm and 1 mm.

The second substrate 104 comprises at least one material corresponding for example to a semiconductor such as silicon, or glass, or sapphire. The thickness of the second substrate 104 is for example equal to several hundred microns. The nature of the material of the second substrate 104 and its thickness depend notably on the type of components that will be produced from the MIM structure 100.

A separation interface, which will serve thereafter to separate the first and second substrates 102, 104 from each other, is formed on the first substrate 104. This separation interface is formed between a first separation layer 106 which is arranged on the first substrate 104 and a second separation layer 108 which is arranged on the first separation layer 106.

In the particular embodiment described here, this separation interface corresponds to a low adherence force interface formed between the first separation layer 106 which includes $SiO_2$ and/or silicon nitride such as SiN and/or $Si_3N_4$, and the second separation layer 108 which includes at least one noble metal. The low adherence force between the separation layers 106, 108 is here obtained thanks to the nature of the materials of the separation layers 106, 108 which only adhere weakly to each other. The material of the first separation layer 106 may advantageously correspond to $SiO_2$. The first separation layer 106 is for example produced by thermal oxidation of the upper face of the first substrate 102. The thickness of the first separation layer 106 is for example comprised between around 1 nm and 20 μm, and here equal to around 500 nm.

The noble metal of the second separation layer 108 comprises at least one of the following elements: platinum, gold, silver, rhodium, osmium, palladium, ruthenium, iridium. The thickness of the second separation layer 108 is for example comprised between around 1 nm and 200 nm. This second separation layer 108 is for example formed by a deposition of the desired metal, for example of PVD (physical vapour deposition) type.

An insulator layer 110 including at least one perovskite structure material is produced on the second separation layer 108. In the particular embodiment described here, the perovskite structure material is formed by crystallisation on the second separation layer 108 which thus forms the crystallisation layer of this material. To do so, the second separation layer 108 comprises platinum.

The perovskite structure material of the insulator layer 110 has for example a chemical composition of $ABO_3$ type, with A and B corresponding to two chemical elements different from each other. Advantageously, this material corresponds to BST or PZT or BCTZ or STO. Other perovskite structure materials may however be used, such as for example KNN ($KNa_xNb_{1-x}O_3$), and of which the thickness is for example comprised between around 1 nm and 20 μm and here equal to around 500 nm. The nature of the material crystallised to form the insulator layer 110 as well as the thickness of this insulator layer 110 depends notably on the type of components that will be produced from the MIM structure 100. The material of the insulator layer 110 is for example deposited by a sol-gel type method. The material of the insulator layer 110 is then obtained by a succession of steps of spreading a sol-gel solution by spin coating and calcination (to eliminate the organics) and crystallisation/densification annealings. The number of spin-coated layers is a function of the desired final thickness, knowing that a crystallised monolayer typically has a thickness comprised between around 1 nm and 150 nm depending on the concentration of the solution used. During the formation or the annealing of the material of the insulator layer 110 the maximum temperature reached is for example comprised between around 400° C. and 900° C.

A first tie layer 112 and a first layer 114 forming a diffusion barrier are next formed on the insulator layer 110. The first tie layer 112 enables the correct maintaining of the first barrier layer 114 on the insulator layer 110, and the first barrier layer 114 is intended to avoid, during the later making integral between the layers intended to form together a first electrode of the MIM structure 100, a diffusion of atoms coming from the layers made integral with this first electrode into the insulator layer 110.

In the particular embodiment described here, the first tie layer 112 comprises for example W and/or Ti and/or Cr and/or Ru, or any other material which can be deposited correctly on the insulator layer 110 and enabling the later deposition of the first barrier layer 114. The thickness of the first tie layer 112 is for example equal to around 10 nm, and more generally comprised between around 5 nm and 10 nm. In addition, the first barrier layer 114 comprises for example WN and/or TiN, and has a thickness for example less than or equal to around 60 nm.

The first part of the MIM structure 100 prepared on the first substrate 102 is terminated by depositing a first gold and/or copper layer 116 on the first barrier layer 114. This first gold and/or copper layer 116 is intended to serve as layer for making integral by thermocompression with another gold and/or copper layer, and to form next with this other gold and/or copper layer the first electrode of the MIM structure 100. The thickness of this first gold and/or copper layer 116 is for example comprised between around 20 nm and 2 μm.

In parallel with the production of the first part of the MIM structure 100 on the first substrate 102, a second part of the MIM structure 100 is produced on the second substrate 104, and is also shown in FIG. 1.

An electrical insulation layer 118 is firstly produced on the second substrate 104 which here corresponds to a semiconductor substrate, for example silicon. This electrical insulation layer 118 comprises for example semiconductor oxide advantageously corresponding to $SiO_2$. The layer 118 is for example produced by thermal oxidation of the upper face of the second substrate 104. This thermal oxidation forms an oxide layer 120 similar to the layer 118 at the rear face of the second substrate 104 (such an oxide layer may be present on the rear face of the first substrate 102). The thickness of the electrical insulation layer 118 is for example comprised between around 200 nm and 5 μm, and here equal to around 500 nm.

A second tie layer 122 and a second layer 124 forming a diffusion barrier are next formed on the electrical insulation layer 118. The second tie layer 122 enables the correct maintaining of the second barrier layer 124 on the layer 118, and the second barrier layer 114 is intended to avoid, during the later making integral between the layers intended to form together a first electrode of the MIM structure 100, a diffusion of atoms coming from the made integral layers of this first electrode into the insulator layer 118 and into the second substrate 104.

In the particular embodiment described here, the second tie layer 122 comprises for example W and/or Ti and/or Cr and/or Ru, or any other material that can be deposited correctly on the insulator layer 118 and enabling the later deposition of the second barrier layer 124. The thickness of the second tie layer 122 is for example equal to around 10 nm, and more generally comprised between around 5 nm and 10 nm. In addition, the second barrier layer 124 comprises for example WN and/or TiN, and has a thickness for example less than or equal to around 60 nm.

The second part of the MIM structure 100 prepared on the second substrate 104 is terminated by depositing a second gold and/or copper layer 126 on the second barrier layer 124. This second gold and/or copper layer 126 is intended to serve as layer for making integral by thermocompression with the first gold and/or copper layer 116, and to form next with the first gold and/or copper layer 116 the first electrode of the MIM structure 100. The thickness of this second gold and/or copper layer 116 is for example comprised between around 20 nm and 2 μm, and for example similar to that of the first gold and/or copper layer 116.

In order to be able to carry out a thermocompression between the layers 116, 126, these two layers comprise a same material, here gold or copper. As an example, the first and second gold and/or copper layers 116, 126 may comprise copper and each have a thickness equal to around 500 nm. According to another exemplary embodiment, the first and second gold and/or copper layers 116, 126 may comprise gold, and may each have a thickness equal to around 50 nm.

In an alternative, it is however possible that one and/or the other of these layers 116, 126 corresponds to a stack of several different layers, for example a stack of a first layer of copper and a second layer of gold. The thermocompression is in this case carried out between the two layers of gold of each of these stacks.

As shown in FIG. 2, the first and second gold and/or copper layers 116, 126 are made integral with each other by the implementation of a thermocompression. These two layers thereto-bonded to each other form together the first electrode of the MIM structure 100. This bonding by thermocompression is for example implemented at a temperature comprised between around 20° C. and 400° C., by applying a compressive force comprised between around 1 kN and 50 kN, and for a duration comprised between around 1 min and 30 min. The parameters for implementing this thermocompression are notably adapted as a function of the properties of the gold and/or copper layers 116, 126.

Within the stack thereby obtained, the low adherence force interface formed between the separation layers 106, 108 corresponds, among all the interfaces of the stack, to that which has the lowest adherence force between two successive layers of the stack.

The MIM structure 100 is terminated by carrying out a mechanical separation at the interface between the first and second separation layers 106, 108, this interface being shown in dotted lines in FIG. 2. This mechanical separation is for example carried out by introducing a blade between the two wafers.

At the end of this separation, a gold and/or copper layer 127 is deposited on the second separation layer. The MIM structure 100 obtained is shown in FIG. 3. This MIM structure 100 is notably formed of the insulator layer 110 arranged between the first electrode, formed by the layers 116 and 126 thereto-bonded to each other, and a second electrode formed here by the second separation layer 108 which comprises platinum and the gold and/or copper layer 127.

After the mechanical separation carried out between the separation layers 106, 108, the first separation layer 106 remains integral with the first substrate 102. The separation between the first and second separation layers 106, 108 is clean and net. This first substrate 102 may be reused to produce for example a new MIM structure by implementing once again the steps described previously with a new second substrate 104.

Figure 5:
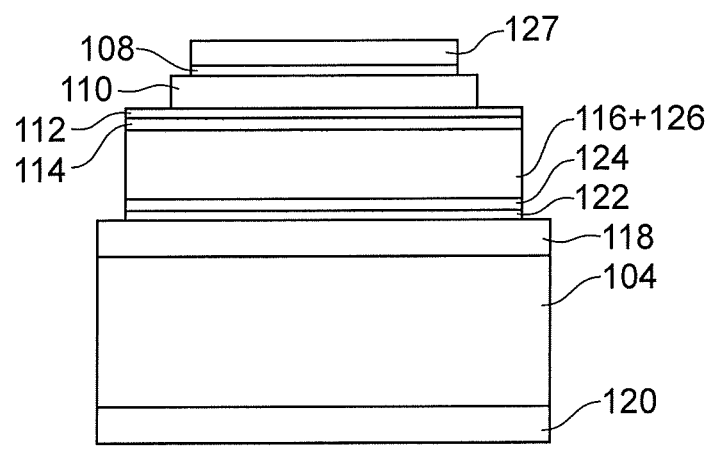
FIG. 5 schematically shows an MIM capacitance obtained after etching of the MIM structure produced.

From the MIM structure 100 thereby produced, it is possible to structure/etch the layers of this structure according to the desired patterns to form for example piezoelectric and/or pyroelectric and/or ferroelectric transducers, MIM type capacitors/capacitances, or instead ferroelectric memories. As an example, FIG. 5 shows schematically and in a simplified manner an MIM capacitance obtained after etching of the layers of the MIM structure 100.

When the components produced from the MIM structure 100 correspond to RF components, the second substrate 104 on which the MIM structure 100 is produced advantageously corresponds to a HR, or High Resistivity, silicon substrate.

In the particular embodiment described above, the second electrode of the MIM structure 100 is formed by the second separation layer 108 and by the gold and/or copper layer 127 which makes it possible to reduce the overall resistivity of the second electrode of the MIM structure 100 compared to a second electrode that would comprise uniquely the second separation layer 108. According to another alternative, after the mechanical separation carried out at the interface of the separation layers 106, 108, it is possible to etch the second separation layer 108, then to deposit one or more metal layers forming the second electrode of the MIM structure 100, for example a gold and/or copper layer having the desired thickness to form on its own this second electrode.

In an alternative of the particular embodiment described above, it is possible not to produce the first barrier layer 114 and/or the second barrier layer 124. Indeed, if the temperature reached during the thermocompression and the thicknesses of the gold and/or copper layers 116, 126 are such that atoms of gold and/or copper do not diffuse into the insulator layer 110 and/or into the second substrate 104, it is then possible not to produce one and/or the other of these barrier layers 114, 124. However, even in the absence of the first barrier layer 114 and/or the second barrier layer 124, the first and second tie layers 112, 122 make it possible to obtain a good adherence of the layers 116, 126.

In the exemplary embodiment described above, the rear face of the second substrate 104 is covered by the oxide layer 120. In an alternative, it is possible to remove this oxide layer 120 by carrying out a de-oxidation of the rear face of the second substrate 104, as for the first substrate 102.

In the embodiment described previously, the making integral step is carried out by thermocompression between the layers 116 and 126.

According to another embodiment, it is possible to produce the structure 100 by implementing the following steps.

The stack of layers 106, 108, 110, 112, 114 and 116 is firstly produced on the first substrate 102. In this other embodiment, the gold and/or copper layer 116 is configured to form on its own the first electrode of the structure 100. Thus, the layer 116 is formed with a thickness corresponding to the final thickness desired for this first electrode.

The layers 118, 122, 124 are also produced on the second substrate 104.

At least one adhesive layer, for example a layer of polymer glue, is next produced on the layer 124 (instead of the gold and/or copper layer 126), and/or on the gold and/or copper layer 116. It is thus possible to produce an adhesive layer on the layer 124, and/or to produce an adhesive layer on the gold and/or copper layer 126.

The two substrates 102, 104 are next made integral with each other through the adhesive layer(s) that is are arranged between the layer 116 and the layer 124.

The mechanical separation is next carried out at the interface between the layers 106, 108 in order to separate the first substrate 102 vis-à-vis the second substrate 104 and the other layers integral with the second substrate 104.

According to another embodiment, it is possible to produce the structure 100 by implementing the following steps.

The stack of layers 106, 108, 110, 112, 114 and 116 is firstly produced on the first substrate 102. In this other embodiment, the gold and/or copper layer 116 is configured to form on its own the first electrode of the structure 100. Thus, the layer 116 is formed with a thickness corresponding to the final thickness desired for this first electrode.

The layers 118, 122, 124 are also produced on the second substrate 104.

A first direct bonding layer, including for example $SiO_2$, Si or SiN, is next produced on the gold and/or copper layer 116, and a second direct bonding layer is produced on the layer 124.

The two substrates 102, 104 are next made integral with each other by direct bonding, or molecular bonding, of the first and second direct bonding layers one against the other.

The mechanical separation is next carried out at the interface between the layers 106, 108 in order to separate the first substrate 102 vis-à-vis the second substrate 104 and other layers integral with the second substrate 104.

In the embodiments and the alternatives described previously, the low adherence force interface is formed thanks to the intrinsic properties of the materials of the separation layers 106, 108, due to the fact that $SiO_2$ and/or silicon nitride and a noble metal adhere poorly to each other.

In an alternative, it is possible that the low adherence force of the interface between the donor substrate (first substrate 102) and the layers to transfer onto the receiver substrate (second substrate 104) is obtained thanks to the implementation of at least one specific step voluntarily degrading the adherence properties of this interface and reducing the adherence force at this interface between the materials of the first and second separation layers 108, 110. As an example, after or during the deposition of the insulator layer 110 of which the perovskite structure material comprises lead, such as for example PZT, it is possible to implement a thermal treatment making atoms of lead coming from the material of the insulator layer 110 diffuse into the $SiO_2$ of the first separation layer 106, through the second separation layer 108 which comprises for example platinum. With such a thermal treatment, for example implemented at a temperature greater than or equal to around 700° C., a $SiO_2$+Pb mixture in liquid phase forms at the interface between the first and second separation layers 106, 108. When the temperature drops, cavities are then created at this interface, in the layer formed of the $SiO_2$ and lead mixture.

Figure 4:
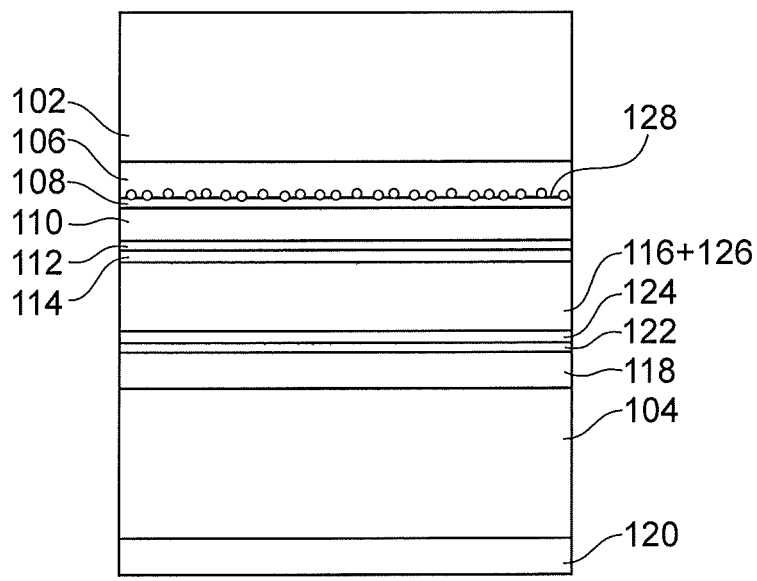
FIG. 4 shows a stack of materials obtained in the course of the method for producing the MIM structure, according to an alternative embodiment.

FIG. 4 shows the structure obtained after the making integral step. This structure comprises, at the interface formed between the separation layers 106, 108, cavities 128 created following the diffusion of atoms of lead coming from the perovskite structure material of the insulator layer 110 into the $SiO_2$ of the first separation layer 108. These cavities 128 reduce the adherence between the separation layers 106, 108.

This degradation, or reduction, of the adherence force of the interface between the separation layers 106, 108 may thus be carried out when the intrinsic properties of the materials used for these separation layers 106, 108 do not bring about, without additional intervention, the formation of a low adherence force interface. The separation layers 106, 108 may in this case be produced from materials other than $SiO_2$ and/or silicon nitride and a noble metal. As an example, the first separation layer 106 may in this case comprise $TiO_2$ and/or $ZrO_2$ and/or ZnO. In an alternative, it is possible to produce such cavities 128 to further weaken the adherence force at an interface corresponding to that having the lowest adherence force in the entire stack produced.

In the embodiment described previously, the second substrate 104 on which the MIM structure 100 is produced corresponds to a layer of non-structured material. In an alternative, it is possible that cavities are produced through at least one part of the thickness of the second substrate 106, from the rear face of this second substrate 106, in order that the MIM structure 100 can be used to form membranes of devices produced from the MIM structure 100.

The MIM structure 100 produced may advantageously serve for the production of components forming electromechanical transducers integrating materials that are going to make it possible to fulfil actuator and/or sensor functions. The sensor function is obtained by direct piezoelectric effect (a mechanical stress causes the appearance of electrical charges in the material) whereas the actuator function is obtained by reverse piezoelectric effect (in this case an electric polarisation external to the material causes a mechanical deformation of the latter).

To fulfil the actuator function, a piezoelectric material having a transverse piezoelectric coefficient d31 the highest possible is generally chosen. This is the case of PZT (or doped PZT (La, Mn, Nb), KNN, BNT-BT, or PMN-PT).

To fulfil the sensor function, a material having a better compromise between a high transverse piezoelectric coefficient e31 and a low dielectric permittivity $\varepsilon_r$, that is to say with the greatest Figure of Merit FOM=e31/$\varepsilon_r$, is generally chosen. This is the case typically of AlN (or Sc doped AlN).

Certain piezoelectric MEMS/NEMS devices operate both in actuator mode and in sensor mode. This is the case of PMUTs (Piezoelectric Micromachined Ultrasonic Transducers). They operate as actuators to emit acoustic waves (emission) and as sensors to receive acoustic waves in return (reception). PMUT devices integrate a same piezoelectric material which is going to enable both the emission of ultrasound (US) waves and the reception of US waves in return. Electromechanical transducers very often comprise a drum skin type membrane, that is to say a membrane (elastic layer+so-called "motor" layer (piezoelectric or other)) suspended above a cavity.

The MIM structure 100 produced may serve to produce such an electromechanical transducer structure.

The different exemplary and alternative embodiments described above may be combined with each other.

The invention claimed is:

1. A method for producing a metal-insulator-metal (MIM) type structure, comprising:
   producing, on a face of a first substrate, first and second separation layers arranged one against the other and such that the first separation layer is arranged between the first substrate and the second separation layer;
   producing, on the second separation layer, at least one insulator layer including at least one perovskite structure material;
   producing at least one first gold and/or copper layer on the insulator layer and being configured to form at least one part of a first electrode of the MIM type structure;

making the first gold and/or copper layer integral with a second substrate such that the first gold and/or copper layer is arranged between the insulator layer and the second substrate; and forming a mechanical separation at an interface between the first and the second separation layers, such that the first separation layer remains integral with the first substrate and that the second separation layer remains integral with the insulator layer, wherein the insulator layer is arranged between the first electrode and a second electrode comprising at least one metal layer.

2. The method according to claim 1, further comprising, before the making integral step, a step of producing at least one second gold and/or copper layer on the second substrate, and wherein the making integral step comprises making the first and the second gold and/or copper layers integral one against the other, the first electrode of the MIM type structure being formed of the first and the second gold and/or copper layers.

3. The method according to claim 2,
wherein the first and the second layers forming the first electrode comprise gold or copper, and
wherein the making integral step further comprises the implementation of a thermocompression of the first and the second layers one against the other.

4. The method according to claim 1, wherein the making integral step is implemented:
through at least one adhesive layer produced on the first gold and/or copper layer, and/or on the second substrate, or
by direct bonding between a first bonding layer produced on the first gold and/or copper layer, and a second bonding layer produced on the second substrate.

5. The method according to claim 1, wherein the second separation layer corresponds to the at least one metal layer of the second electrode.

6. The method according to claim 5, further comprising, after the forming the mechanical separation step, a step of producing a third gold and/or copper layer on the second separation layer.

7. The method according to claim 1,
wherein the second separation layer is configured to form a crystallisation layer of the perovskite structure material, and
wherein the producing of the at least one insulator layer comprises a crystallisation of the perovskite structure material on the second separation layer.

8. The method according to claim 1,
wherein the making integral step forms a stack of different materials chosen such that the interface between the first and the second separation layers corresponds to that having a lowest adherence force among all interfaces of the stack, and
wherein:
one of the first and the second separation layers comprises at least $SiO_2$ and/or silicon nitride and the other of the first and the second separation layers comprises at least one noble metal, and/or
the method comprises, between the step of producing the first and the second separation layers and the making integral step, the implementation of at least one step of reducing an initial adherence force of the interface between the first and the second separation layers.

9. The method according to claim 8, wherein the noble metal comprises platinum.

10. The method according to claim 8, wherein:
the perovskite structure material comprises lead,
the one of the first and the second separation layers comprises $SiO_2$, and
the at least one step of reducing the initial adherence force of the interface between the first and the second separation layers comprises the implementation of at least one thermal treatment forming, at the interface between the first and second separation layers, an alloy of lead and $SiO_2$ in liquid phase, then a cooling forming cavities at the interface between the first and the second separation layers.

* * * * *